Figure 1A:
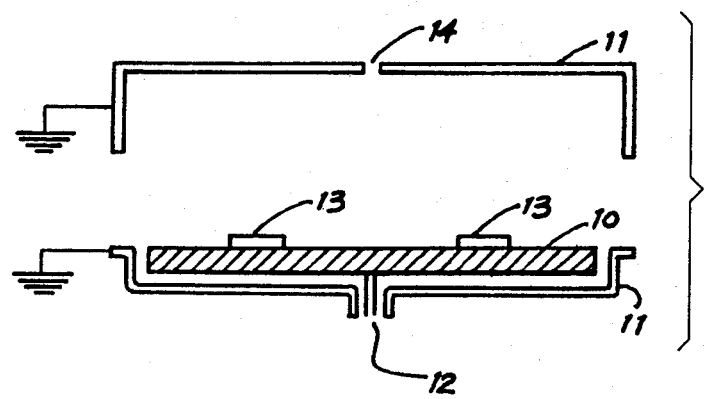

United States Patent [19]

Horwitz

[11] Patent Number: 4,521,286
[45] Date of Patent: Jun. 4, 1985

[54] HOLLOW CATHODE SPUTTER ETCHER

[75] Inventor: Christopher M. Horwitz, Summer Hill, Australia

[73] Assignee: Unisearch Limited, Kensington, Australia

[21] Appl. No.: 587,123

[22] Filed: Mar. 7, 1984

[30] Foreign Application Priority Data

Mar. 9, 1983 [AU] Australia ................................ PF8365

[51] Int. Cl.[3] .............................................. C23C 15/00
[52] U.S. Cl. ................................ 204/192 E; 156/646;
204/192 R; 204/192 EC; 204/298
[58] Field of Search ............ 204/298, 192 EC, 192 E, 204/192 R; 156/646

[56] References Cited

U.S. PATENT DOCUMENTS 4,407,712 10/1983 Henshaw et al. .................... 204/298
4,462,882 7/1984 Horwitz ............................ 204/192 E
4,465,551 8/1984 Horwitz ......................... 204/192 EC

OTHER PUBLICATIONS

Reinberg et al., Extended Abstracts, V. 81-2, Electrochem. Soc.
Ianno et al., J. Electrochem. Soc. 128:2175, 1981.
Pillow, Spectrochimica Acta, vol. 36B, No. 8, pp. 821-843, 1981.
Horwitz, Appl. Phys. Lett. 43(10), 1983.
Griffin et al., IEEE Trans. on Elec. Devices, vol. ED-27, No. 3, 1980.

Primary Examiner—Arthur P. Demers
Attorney, Agent, or Firm—Holman & Stern

[57] ABSTRACT

There is disclosed a dry process etching or deposition chamber which allows an improvement in process speed and control of directionality over prior art dry process chambers. The etching or deposition chamber is provided with a hollow cathode electrode comprising two parallel electrode surfaces which are maintained at substantially the same electrical potential while a radio frequency potential is applied between the hollow cathode electrode and an anode electrode which is also located within the chamber. During the etching or deposition process, a partial vacuum is maintained in the dry process chamber and a gas is introduced into the chamber to provide a source of halogen ions and carbon or silicon ions under radio frequency excitation these ions forming a chemically reactive plasma. Products of the etching or deposition process can be pumped out of the chamber during the processing step if greater performance is required.

19 Claims, 13 Drawing Figures

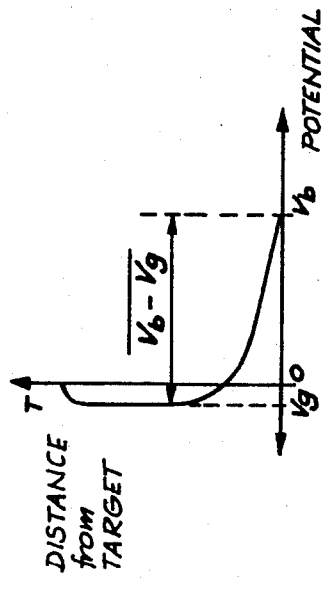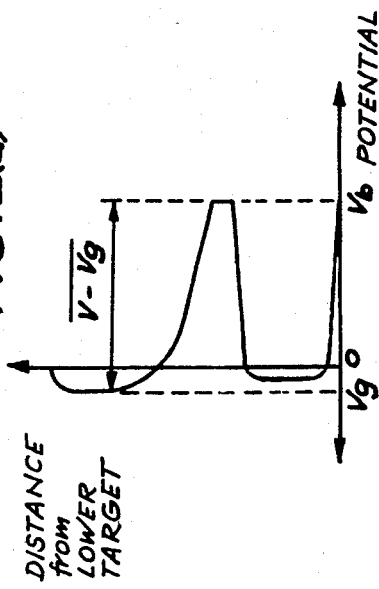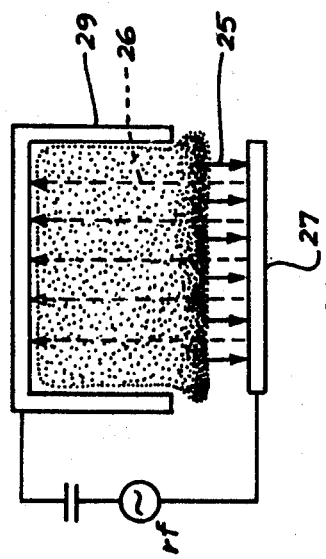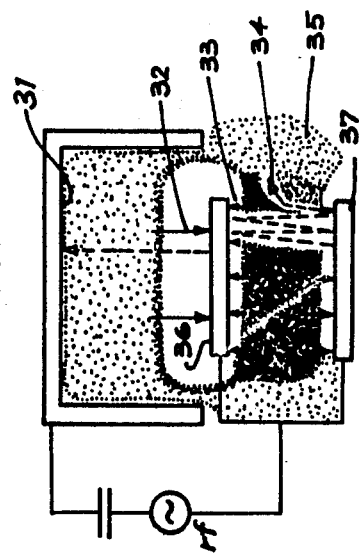

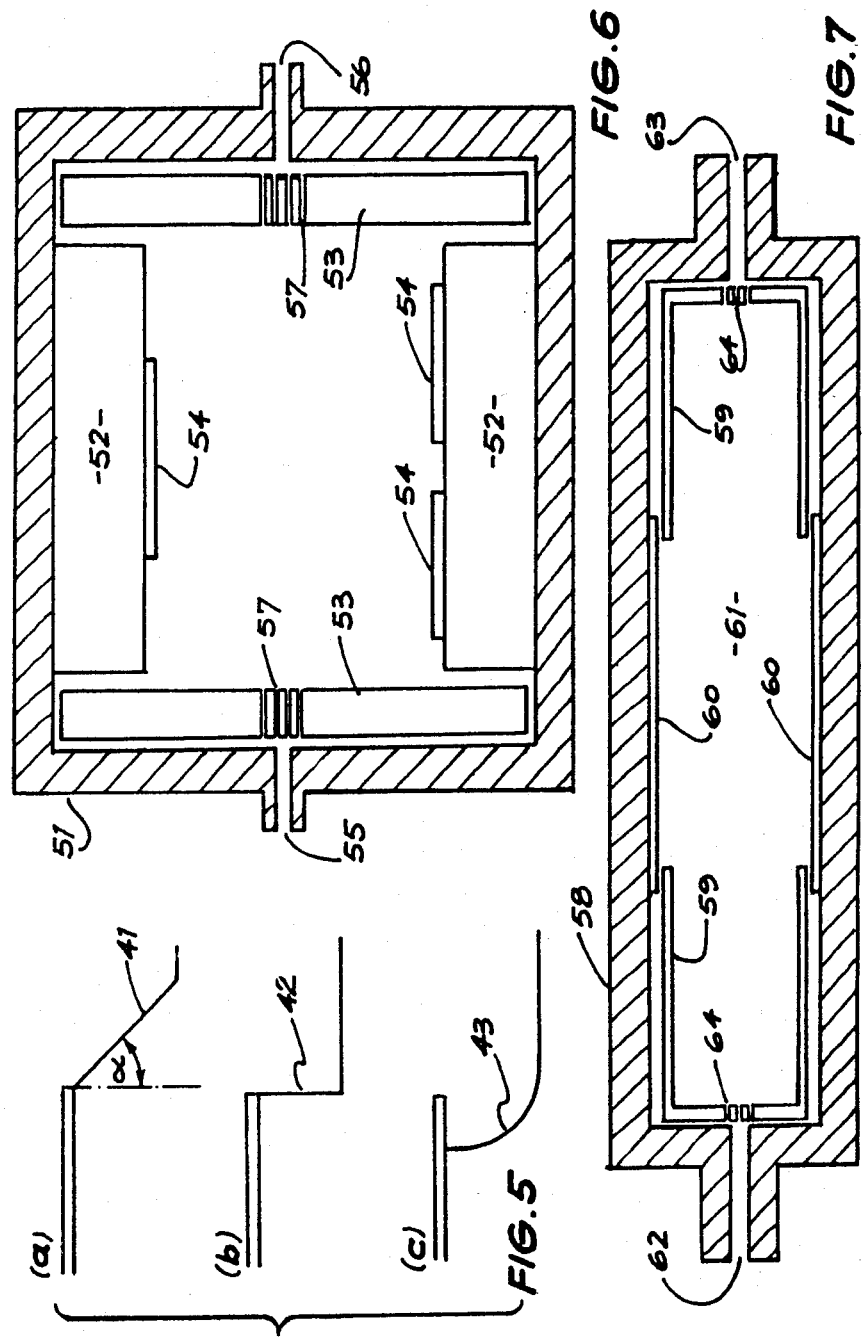

HOLLOW CATHODE SPUTTER ETCHER

The present invention relates generally to rf (radio frequency) Sputter apparatus for use in integrated circuit manufacture, printed circuit board descumming and ceramic substrate machining for computer fabrication.

In dry process methods such as reactive sputtering, etching and deposition occur at the same time, however, in etching processes the etching rate is greater than the deposition rate, while in deposition processes the deposition rate is greater than the etching rate. The relative etching and deposition rates are determined by the materials, the reactive gases used, the geometry of the etched surface and the discharge parameters.

Reactive sputtering is a versatile etch and deposition process that uses chemically reactive components of a low-pressure discharge to obtain well-controlled and directional etching, often with high selectivity between materials or well controlled deposition of thin films. It is widely used in the fabrication of microelectronic devices, especially on Si wafers, in both "batch" and "single wafer" configurations. In the latter, a high rate of etching or deposition is desirable. In a parallel-plate electrode system high rates are obtained at pressures of around 100 Pa (1.33 Torr), and for this reason most single wafer etchers operate in this regime. However, when etching at these high pressures there is a large chemical component of the etch rate and a low ion energy at the substrate, resulting in problems with etch directionality and with sensitivity of the etch rate to loading, temperature and to substrate pattern geometry. High etching rates have been achieved at low pressures using either scanned magnetic fields or a hot filament triode system. Both of these methods increase the ionization in the discharge.

The present invention provides another method of increasing ionization which does not use magnetic fields or external ionization sources, but which results in uniform deposition or etching at very high rates. This method employs a "hollow cathode" electrode, which, while it has been used in the past for a variety of purposes, has not previously been used with either rf excitation, or with chemically reactive etching or deposition discharge components in the form described herein.

The term "hollow cathode electrode" as used herein refers to a structure comprising two planar electrode surfaces which are placed parallel to and facing one another, and which are maintained at similar electrical potentials. That is, the potential difference between the two electrode surfaces is a small fraction (say 30% or less) of the total voltage applied to the etching chamber.

Various prior art etching processes are listed in table 1. This table also lists the disadvantages exhibited by these processes for which an improvement is achieved in the method of the present invention.

TABLE 1

| Prior art process | Problem |
| --- | --- |
| Batch wafer etching, low pressure | slow |
| | vertical profile |
| Single wafer etching, low pressure | very slow |
| | vertical profile |
| Batch wafer etching, high pressure | Isotropic profile |
| | Pattern sensitivity |
| Single wafer etching, high pressure | Isotropic profile |
| | Pattern sensitivity |
| Magnet under single wafer, low pressure | Non-uniform etching |

TABLE 1-continued

| Prior art process | Problem |
| --- | --- |
| Triode system, low pressure | Vertical profile |
| | Non-uniform etching |
| | Vertical profile |
| | Contaminates |

According to a first aspect, the present invention consists in a dry process etching or deposition chamber comprising:

a vacuum chamber enclosing two radio frequency electrodes, one of which is formed as a hollow cathode as hereinbefore defined;

a source of radio frequency potential connected between said pair of electrodes;

inlet means for introducing a gas into the vacuum chamber, which gas becomes chemically reactive, when ionized by a radio frequency discharge, to perform etching and deposition processes upon target material positioned on internal surfaces of the hollow cathode.

According to a second aspect, the present invention consists in a method of dry process etching or deposition, comprising the steps of:

positioning target material on internal surfaces of a hollow cathode electrode as hereinbefore defined, said hollow cathode electrode being one of a pair of radio frequency electrodes disposed within a vacuum chamber;

applying radio frequency potential between said electrodes; and introducing a gas into said chamber, which gas, when excited by radio frequency energy, forms a chemically reactive plasma, said plasma performing etching and deposition processes upon said target material.

In one embodiment of the invention, discharge within the hollow cathode is confined by an insulating material such as a quartz ring located therein.

The preferred embodiment of the invention includes means for pumping the volatile etch or deposition products out of the chamber.

The operating pressure for an etching chamber of the present invention may be within the range 0.1–500 Pa but is typically within the range 0.1–10 Pa, however, lower quality vacuum pumps, which allow operation in the pressure range of 5–40 Pa, may be used without any significant effect to the etching process. The applied rf voltage may be within the range 0.1–4 kV but is preferably within the range 0.5–1.5 kV peak-to-peak and the radio frequency employed may be in the range 100 KHz–100 MHz but is typically in the order of 13 MHz.

The gas used in an etching chamber according to the present invention should provide a source of hydrogen or halogen ions, typical examples of such gases being $CF_4$, $SiF_4$, $SiCl_4$ and a mixture of $SiF_4$, $O_2$ and $H_2$.

Figure 1B:
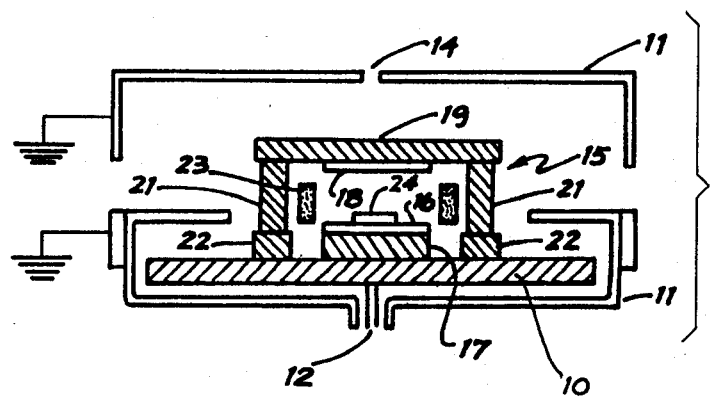

An embodiment of the invention will now be described by way of example with reference to the accompanying drawings in which:

FIG. 1(a) schematically illustrates a prior art sputter etching chamber;

FIG. 1(b) schematically illustrates a sputter etching chamber similar to the prior art chamber of FIG. 1(a) wherein the rf electrode is modified to form a hollow cathode in accordance with the present invention;

FIG. 2(a) schematically illustrates the operation of a prior art two electrode rf reactive sputtering system;

FIG. 2(b) schematically illustrates the operation of a hollow cathode reactive sputtering system similar to that illustrated in FIG. 1(b);

FIG. 2(c) graphically illustrates the averaged (dc) potential variation in the etching chamber of FIG. 2(a) as a function of distance from the target in the direction of the upper chamber wall;

FIG. 2(d) graphically illustrates the averaged (dc) potential variation in the etching chamber of FIG. 2(b) as a function of distance from the lower target in the direction of the upper chamber wall;

FIG. 3 graphically illustrates etch rates for various materials, and discharge input power, versus pressure at constant rf voltage and gas flow rate for a hollow cathode reactive sputtering system for: (a) heatsunk substrates; and (b) non-heatsunk substrates;

FIG. 4 graphically illustrates etch rates for various materials, and discharge input power, versus peak-to-peak voltage on the rf electrode at constant gas pressure and flow rate in a hollow cathode reactive sputtering system for: (a) heatsunk substrates; and (b) non-heatsunk substrates;

FIG. 5 illustrates (a) the variable angled straight walled profile produced by apparatus of the present invention, (b) a vertical profile produced by a prior art process and (c) an under-cut profile produced by a prior art process; and FIGS. 6 and 7 schematically illustrate second and third embodiments respectively of a hollow cathode sputter etching and deposition chamber in accordance with the present invention.

It should be noted that in FIGS. 3 and 4 'AZ' denotes AZ 1350 photoresist.

The prior art chamber illustrated schematically in FIG. 1(a) is a modified Perkin-Elmer 3140-8J single target sputtering system operating at 13.56 MHz.

The chamber of FIG. 1(a) comprises an rf electrode 10 mounted in an earthed chamber 11, the electrode being supplied with rf power via an rf input 12 and the substrates 13 to be etched being located on the electrode 10. The reactive gas is supplied to the chamber through an inlet 14 in the top of the chamber.

By modifying the apparatus of FIG. 1(a), an embodiment of the present invention was produced. In the modified apparatus of FIG. 1(b) a hollow cathode structure 15 was placed on the stainless steel rf electrode plate 10 of the apparatus illustrated in FIG. 1(a). The lower target 16 rests directly on an aluminium block 17 which in turn rests on the rf electrode 10 while the upper target 18 is held against an aluminium disc 19, which forms the upper electrode of the hollow cathode structure 15. This disc 19 is bolted to aluminium pillars 21 which are in turn bolted to an aluminium ring 22 resting on the rf electrode 10. A quartz ring 23 serves to confine the discharge and in the present embodiment was placed on the rf electrode 10, allowing a 10 mm gap between the ring and the upper target. The Si target wafers in FIG. 1(b) were 5 cm in diameter and were spaced by 2 cm. The lower wafer was heatsunk to the rf electrode with DC704 diffusion pump oil. This oil was also used to heatsink the etching test samples 24 which were placed on the lower Si wafer. Other heatsinking methods could have been used but were less flexible.

The input power was measured by a subtractive method which removes the power losses in the matching network from the total input power to arrive at the true discharge power level. Other monitoring, gas control, and etch rate measurements were performed using known methods (C. M. Horwitz, J. Melngailis, J. Vac. Sci. Technol. 19 1408(1981)).

FIG. 2(a) shows the operation of a standard rf sputtering system, wherein the solid lines 25 show ion motions, and the dashed lines 26 show the motions of secondary electrons liberated from the target 27. If the ratio of electrode areas is sufficiently large, ions preferentially bombard the smaller target (cathode) electrode 27 since the glow potential approximates that of the larger upper chamber electrode. (C. M. Horwitz, Journal of Vacuum Science and Technology, A, Volume 1, January–March 1983, p. 60–68). Secondary electrons generated by ion impact travel oppositely to the ions. These electrons are of high energy but at pressures of less than 10 Pa their collision probability with neutrals is too small to cause much ionization in the glow 28. Thus in this pressure regime the glow is maintained by other mechanisms. It will be seen that FIG. 2(c) illustrates the average (dc) potential variation in the chamber; this voltage distribution would be seen by an electron at two times in the rf cycle. The bias voltage ($V_b$) is the average dc voltage which develops between the It will be seen that there are strong voltage gradients in the glow discharge, however, these are only present close to an electrode. The main body of the glow discharge is roughly equipotential, and serves as a convenient voltage reference level, $V_g$. FIG. 2(c) shows the variation of voltage in the discharge of the apparatus of FIG. 2(a), with respect to the chamber 29, as a function of distance from the lower target electrode. Note that both electrodes are more negative than the glow potential, $V_g$. The curve shown is an average of the rapidly fluctuating rf voltages. Heavy ions 25 respond to this average, however, due to their small mass, electrons respond to the instantaneous value of the voltage which varies about the average value shown. After accelerating towards the glow, secondary electrons 26 from the target travel with a roughly constant velocity through the glow and decelerate slightly before colliding with the larger electrode 29. The energy of their collision is equal, on average, to the dc "bias" voltage ($V_b$) measured between the electrodes.

FIG. 2(b) shows the operation of a hollow cathode sputtering system. The upper "chamber" 31 is still the largest electrode, so the glow potential $V_g$ (see FIG. 2(d)) is roughly the potential of the chamber as shown. Hence the top of the central electrode is bombarded by ions 32. In addition, since the glow 35 is at the chamber potential, the "hollow" region between the two lower plates 36, 37 will also be bombarded by ions 33. Secondary electrons 34 liberated by this ion bombardment find themselves in an electric mirror: they are accelerated towards the glow 35 and then decelerated an equal amount as they approach the opposing electrode (for clarity only 2 electrons are shown in this FIG.). The cycle then repeats and the result is oscillation of these secondary electrons between the electrodes 36, 37 until a collision occurs. Calculation of electron motion without consideration of damping phenomena shows that without collisions, the electrons could execute 20–30 oscillations between the electrodes 36, 37 during one rf cycle. Collisions, when they do occur, have a high probability of ionization, and the result is a high level of ionization in the discharge. Factors other than electron trapping are also thought to increase discharge ionization: ions in between the targets are more likely to diffuse toward a target 36, 37 rather than towards the chamber surface 31 in a hollow cathode system; and high-energy photons are more likely to generate photoelectrons.

As in the case of dc hollow cathode devices, the increased ionization permits a high current flow for a given input voltage. In rf terms, a high discharge input power for a given applied rf voltage results. This power is mainly dissipated in between the two opposing targets (which are predominantly negative, thus forming a hollow cathode), and the return current flows to the chamber through the glow 35 surrounding the hollow cathode targets. This current results in a voltage drop in the glow, as shown in FIG. 2(d); the potential in between the hollow cathode targets differs from the glow voltage ($V_g$) above them.

Note that in an etching system the etch rate of the upper Si target is the same as that of the lower Si target. If the etched Si were to redeposit onto the opposing target no net etching would take place. However in the present case, using a reactive gas ($CF_4$) with volatile etch products, the etched Si is pumped out of the chamber.

Figure 3A:
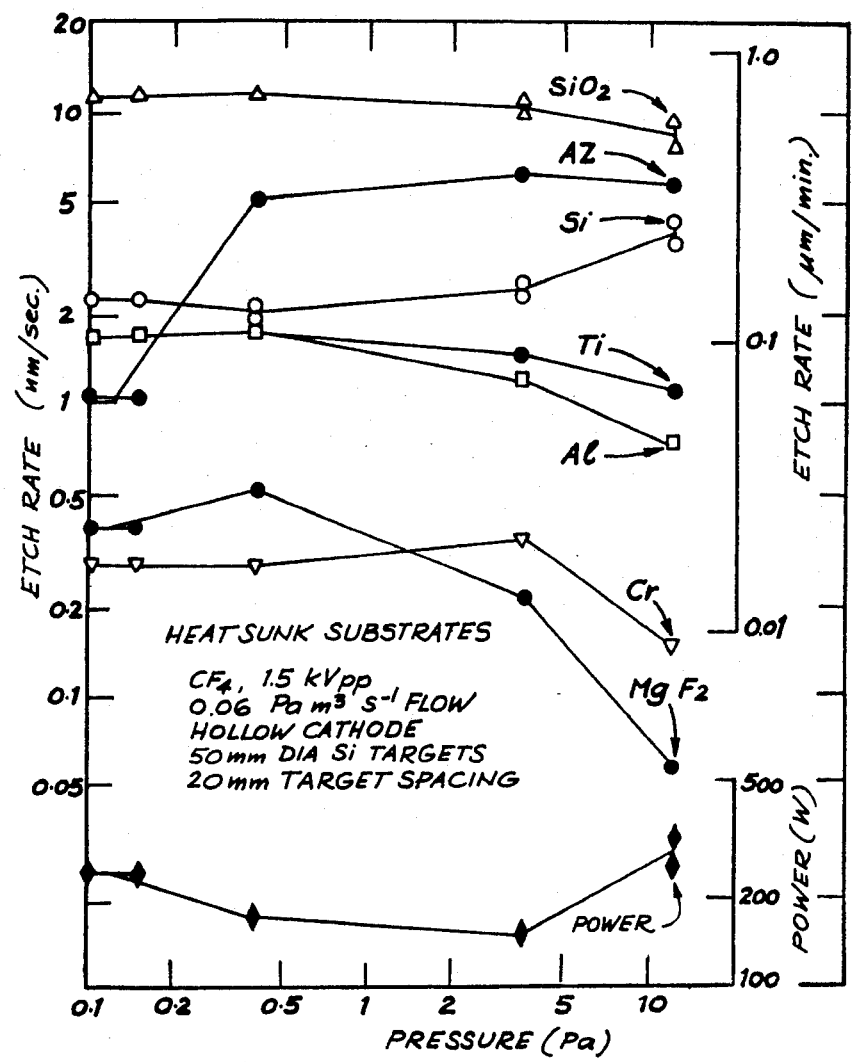
Figure 3B:
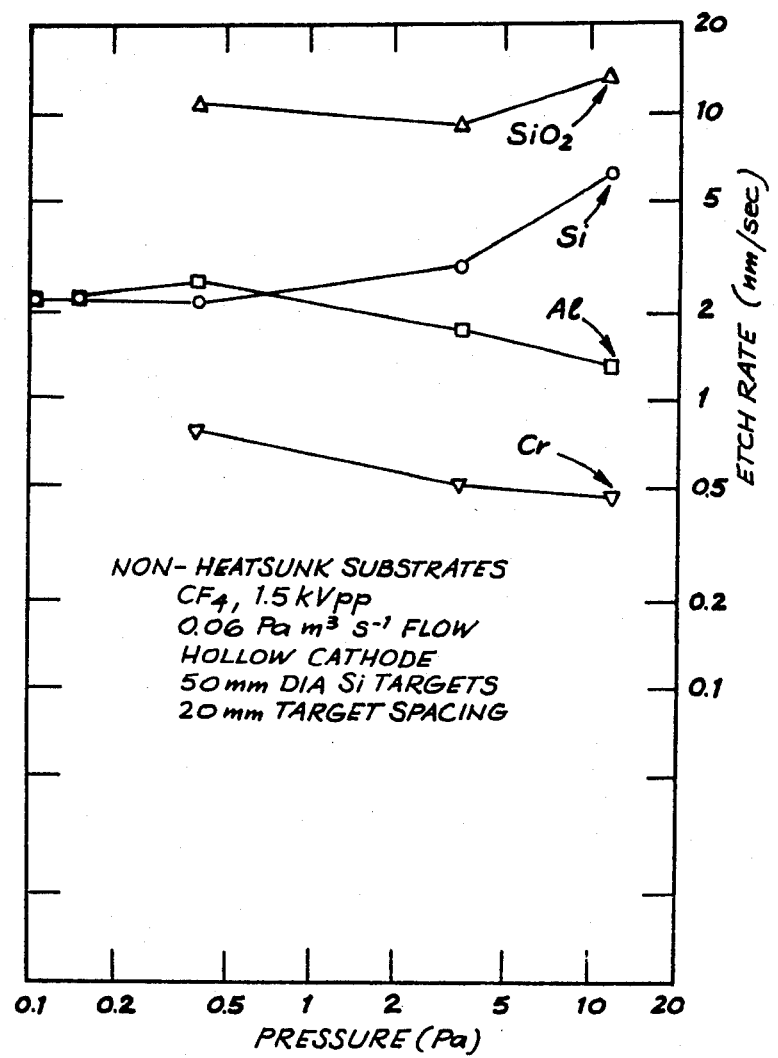

FIG. 3 shows the variation of etch rates and of discharge input power with gas pressure of $CF_4$, FIG. 3(a) illustrating the case where the temperature of the substrate is controlled by providing a thermally conductive compound between the substrate and the electrode upon which it is mounted, while FIG. 3(b) illustrates the case where no heat sinking is provided, resulting in a hot substrate. It is usual to control the temperature of electrodes in a sputter etching chamber, and when a heat sink compound is used between the substrate and the electrode on which it is mounted, the substrate temperature will closely follow that of the electrode. The etching behaviour shown in FIG. 3 differs from that observed in a standard sputtering system in that the input power and etch rates remain fairly constant here, expecially between 0.1 and 5 Pa. This observation holds whether the samples are heatsunk or not and the following is proposed as an explanation. As the pressure decreases a standard sputtering system creates fewer ions, so the dark space size between the target and the glow region increases and the etch rates of materials such as $SiO_2$ fall for a constant applied rf voltage. However in a hollow cathode arrangement there are additional ionization mechanisms which result in a level of ionization which is, in the present apparatus, limited not by the gas pressure but by the generation rate and particle loss mechanisms. The dark space size is thus roughly constant at 3 mm for the conditions shown in FIG. 3, and the etch rates of Si and $SiO_2$ remain roughly constant also. It is possible to achieve etch rates which are a factor of 100 higher than those obtained in standard $CF_4$ sputter etching of $SiO_2$, at 0.1 Pa and 1.5 $kV_{pp}$.

Referring now to FIG. 5(a), etched profiles obtained under the conditions shown in FIG. 3(a) exhibit a side wall slope the angle of which can be varied by altering parameters such as the target temperature, the gas flow rate, and the discharge pressure. This differs from other processes in that a straight side wall 41 is formed and the angle is controlled. Prior art processes can provide either a vertical profile 42 (ref. FIG. 5(b)) or an undercut "isotropic" profile 43 (ref. FIG. 5(c)), and sometimes a mixture of the two which is strongly material- and gas-dependent.

Figure 4A:
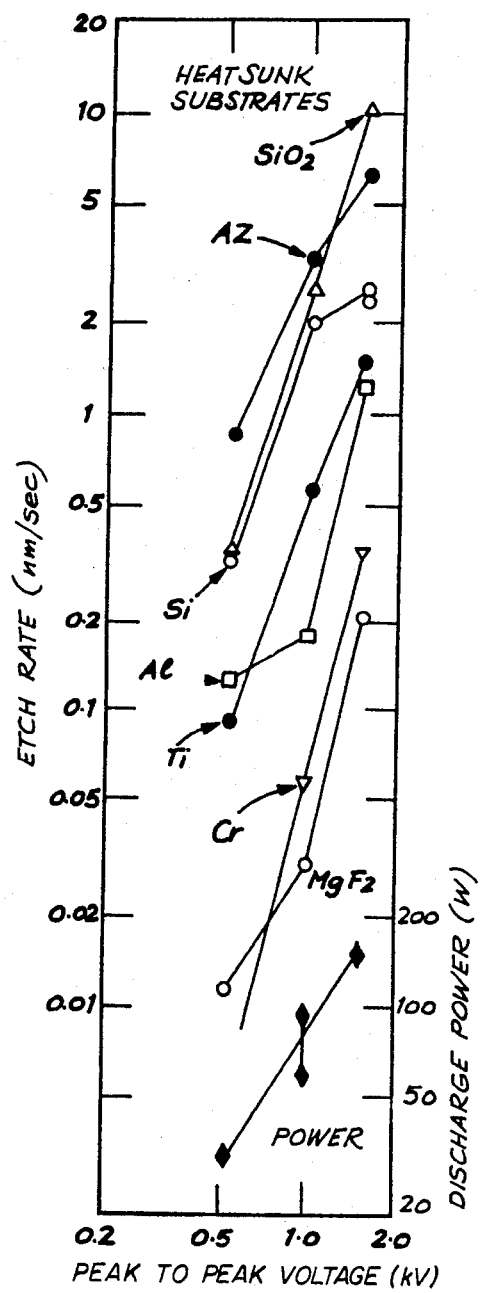
Figure 4B:
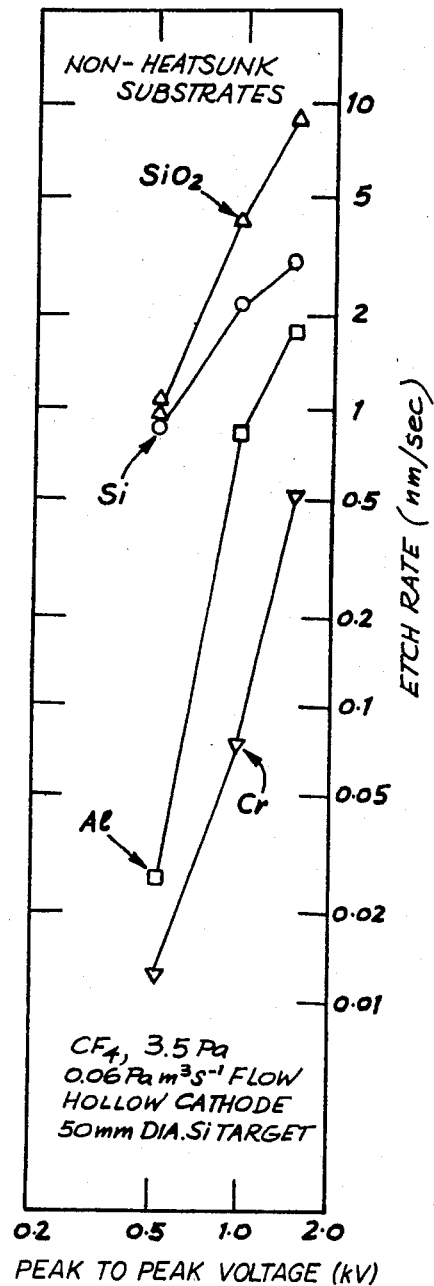

FIG. 4 shows the variation of etch rates and discharge power with the applied peak-to-peak rf voltage, $V_{pp}$, FIG. 4(a) illustrating the case where the substrate is thermally connected to the electrode on which it is mounted, to allow the temperature of the substrate to be controlled, and FIG. 4(b) illustrating the case where no heat sinking is provided for the substrate. This behaviour is similar to that observed with $CF_4$ in a standard sputtering system, in that Si and $SiO_2$ are etched at similar rates for $V_{pp}$ 1 kV, and that Si etches slower than $SiO_2$ at higher voltages.

In conclusion, etch rates up to 100 times larger than can be obtained in standard reactive sputter etching have been observed, at pressures as low as 0.1 Pa (0.75 mTorr).

A second embodiment of the invention is illustrated in cross-section in FIG. 6, wherein a vacuum chamber 51 encloses a pair of disc target electrodes 52 which form a hollow rf cathode assembly. A second rf electrode, in the form of a ring 53, surrounds the pair of discs 52, and the target material 54 is placed on the surfaces of the discs 52 which form the internal surfaces of the hollow cathode. A supply of gas which forms the plasma in the etching or deposition process, is fed into the chamber 51 through an opening 55 in one side thereof, and gaseous products of the etching or deposition process are removed through a second opening 56 in the other side of the chamber. Preferably, perforations 57 are also provided in the electrode 53, in the vicinity of the inlet and outlet openings 55 and 56 respectively.

Although the sputter chamber of FIG. 6 is substantially different in appearance to the chamber illustrated in FIG. 1(b), the mode of operation of this chamber is similar to that previously described with regard to the FIG. 1(b) chamber, and therefore will not be repeated.

A third embodiment of the invention is illustrated in cross-section in FIG. 7 wherein a chamber 58 forms a hollow rf cathode assembly, a cavity 61 defined by the cathode being circular in plan and housing an annular anode 59 which conforms closely with the outer perimeter of the cavity 61. The anode is U-shaped and opens towards the centre of the cavity 61 in order to provide a large active surface area and the target material 60 is placed on the internal surfaces of the chamber 58. Gas used in the etching or deposition process enters the chamber through an inlet opening 62 in one side of the chamber and gaseous products of the etching or deposition process are removed through a second opening 63 in the other side of the chamber. Preferably, perforations 64 are also provided in the annular electrode 59, in the vicinity of the inlet and outlet openings 62 and 63 respectively.

As with the embodiment of FIG. 6, operation of the chamber of FIG. 7 is similar to that described with regard to the FIG. 1(b) chamber and will therefore not be repeated.

It will be recognised by persons skilled in the art that numerous variations and modifications may be made to the invention as hereinbefore described without departing from the spirit or scope of the invention as broadly described.

I claim:

1. A dry process etching or deposition chamber comprising:
   a vacuum chamber enclosing two radio frequency electrodes, one of which is formed as a hollow cathode
   a source of radio frequency potential connected between said pair of electrodes;
   inlet means for introducing a gas into the vacuum chamber, which gas becomes chemically reactive when ionized by a radio frequency discharge to perform etching and deposition processes upon target material positioned on internal surfaces of the hollow cathode.

2. An etching or deposition chamber as claimed in claim 1, wherein an outlet is provided in said vacuum chamber, through which products of the etching and deposition processes are removed.

3. An etching or deposition chamber as claimed in claim 1, wherein the vacuum chamber is a closed metal container having a pair of substantially parallel internal faces which form the hollow cathode electrode.

4. An etching or deposition chamber as claimed in claim 3, wherein the anode is annular.

5. An etching or deposition chamber as claimed in claim 4, wherein the anode is located between the substantially parallel surfaces of the hollow cathode.

6. The etching or deposition chamber as claimed in claim 5, wherein the anode is U-shaped in cross-section, opening inwardly of the hollow cathode.

7. A method of dry process etching or deposition, comprising the steps of:
 positioning target material on internal surfaces of a hollow cathode electrode, said hollow cathode electrode being one of a pair of radio frequency electrodes disposed within a vacuum chamber;
 applying radio frequency potential between said electrodes; and
 introducing a gas into said chamber, which gas when excited by radio frequency energy, forms a chemically reactive plasma, said plasma performing etching and deposition processes upon said target material.

8. The method as claimed in claim 7, wherein the gas is maintained within the vacuum chamber at a pressure within the range of 0.1–500 Pa.

9. The method as claimed in claim 7, wherein the gas is maintained at a pressure within the range of 0.1–10 Pa.

10. The method as claimed in claim 7, wherein the gas is maintained at a pressure within the range of 5–40 Pa.

11. The method of claim 7, wherein the radio frequency potential is within the range of 0.1–4 kV.

12. The method of claim 7, wherein the radio frequency potential is within the range of 0.5–1.5 kV.

13. The method as claimed in claim 7, wherein the radio frequency potential has a frequency within the range of 100 kHz–100 MHz.

14. The method of claim 7, wherein the frequency is in the order of 13 MHz.

15. The method as claimed in claim 7, wherein said gas provides a source of halogen ions when excited by a radio frequency discharge.

16. The method as claimed in claim 7, wherein the gas contains $CF_4$.

17. The method as claimed in claim 7, wherein the gas contains $SiF_4$.

18. The method as claimed in claim 7, wherein the gas contains $SiCl_4$.

19. The method as claimed in claim 7, wherein said gas provides a source of hydrogen ions when excited by radio frequency discharge.

* * * * *